United States Patent [19]
Katz et al.

[11] Patent Number: 5,146,177
[45] Date of Patent: Sep. 8, 1992

[54] BALANCED REFLECTIVE NONLINEAR PROCESSOR USING FETS

[75] Inventors: Allen Katz, Robbinsville; Shabbir S. Moochalla, Kendall Park, both of N.J.

[73] Assignee: General Electric Co., East Windsor, N.J.

[21] Appl. No.: 753,164

[22] Filed: Aug. 30, 1991

[51] Int. Cl.$^5$ .............................. H03F 1/32; H03F 3/60
[52] U.S. Cl. ........................................ 330/149; 330/286
[58] Field of Search ............... 330/149, 277, 286, 302, 330/303, 305; 307/490, 497, 520, 521, 522

[56] References Cited

U.S. PATENT DOCUMENTS 4,564,816  1/1986  Kumar et al. ................. 330/149
5,038,113  8/1991  Katz et al. ..................... 330/277

OTHER PUBLICATIONS

An article entitled "Simple Circuit Instantly Cuts Jammer Signals", by Gagnon, published at pp. 135–140 of the Sep. 1990 issue of Microwaves and RF magazine.

Primary Examiner—Steven Mottola
Attorney, Agent, or Firm—William H. Meise; Stephen A. Young; Clement A. Berard

[57] ABSTRACT

A nonlinear processor for use as a signal limiter or predistortion equalizer includes a four-port, 3dB directional coupler. Signal to be distorted is applied to a first port of the coupler, and is coupled by second and third ports to a pair of nonlinear circuits. Each nonlinear circuit includes the source-to-drain transmission path of a FET. Each nonlinear circuit is grounded or short-circuited, to form a nonlinear reflective circuit which reflects the energy back to the associated port of the coupler. The nonlinearly reflected energy is received at the two coupler ports, and is combined and made available at the fourth coupler port. The input return loss of the processor is improved by matching the nonlinear circuits to each other.

13 Claims, 7 Drawing Sheets

BALANCED REFLECTIVE NONLINEAR PROCESSOR USING FETS

BACKGROUND OF THE INVENTION

This invention relates to nonlinear processors or distortion generators such as limiters or predistortion equalizers for compensating amplitude and phase distortion of power amplifiers at microwave, millimeter-wave or other radio frequencies, and particularly to those using directional couplers.

Electronic signal amplifiers are used to increase the voltage, current or power of electrical signals. Ideally, amplifiers merely increase the signal amplitude without affecting the signal in any other way. However, all signal amplifiers distort the signal being amplified. The distortion results from nonlinearity of the transfer function or characteristic of the active devices of the amplifier. The distortion of a signal passing through an amplifier can be reduced by keeping the peak-to-peak signal amplitude small, and by operating the amplifier so that the signal traverses the central part of its characteristic, in which region it is most linear. However, there are certain situations in which it is necessary for the output signal excursion to extend over a substantial portion of the amplifier transfer function. This is the case in radio and television broadcast transmitters, where such operation is important to obtain the maximum possible output of power from each costly amplifier. The same need to maximize output power also exists in the case of microwave or millimeter-wave frequency (radio frequency or RF) amplifiers for satellite communications, because the ability of the active devices to operate at RF requires a structure which allows them to be operated only at relatively moderate voltage and current and bias levels, so that the signal swings over a significant portion of the available bias. When the output signal swing of an amplifier makes excursions over substantial portions of the transfer function, the usual effect is a relative compression of large signals by comparison with small signals, i.e. the gain of the amplifier at large signal levels tends to be less than the gain at low signal levels. For the case of a sinusoidal signal viewed on an oscilloscope, the compressed output signal is a sinusoid generally similar in appearance to the input signal, but with a somewhat flattened top and bottom. A phase shift often accompanies amplitude distortion. Radio frequency amplifiers are often used to amplify a plurality of signals, as in multichannel satellite operations. When multiple signals are amplified, the peak signal values occasionally become superposed, causing some excursions with large peak-to-peak values. In the case of multichannel signals, compression may not be as easy a measurement to make as intermodulation distortion measurements. Intermodulation distortion measurements are ordinarily made by measuring the relative amount of unwanted products which accompany one of the carriers, which for test purposes is generally itself unmodulated.

Predistortion of a signal which is to be applied to a nonlinear amplifier is often performed in order to precompensate for the distortion expected to be caused by the amplifier's nonlinearity. Among the problems which arise in the design of predistortion circuits is that of finding a nonlinear device or devices and a corresponding circuit configuration which together produce a gain which increases with increasing signal level, to thereby compensate for the decrease in gain with increasing signal level which is caused by the amplifier nonlinearity. The problem is exacerbated, in that tests during the development phase are often performed on the nonlinear device using instruments which are themselves matched to the impedance of a standard transmission line, whereas in actual service the nonlinear device will interact with the input and output impedances of the source and load circuits, including the amplifier being compensated for. The impedance mismatch of the amplifier may interact adversely with any impedance mismatch of the nonlinear device. Since the impedance mismatch often depends upon signal level, complex interactions may occur, including impedance transformations which cause the net amplitude-versus-frequency response of the cascade of predistortion equalizer and amplifier to deviate from that desired.

FIG. 1a is a simplified block diagram of a typical prior art reflective predistortion equalizer. In FIG. 1, signals to be predistorted are applied by way of a terminal 10 and an input transmission line to a first input port 12 of a 90°, 3 dB directional or hybrid coupler 14. Those skilled in the art know that transmission lines are effective in carrying RF signals without excessive losses. Common types of transmission lines include coaxial transmission lines and microstrip transmission lines. The coaxial transmission line, illustrated in cross-section in FIG. 1b, includes an outer electrical conductor 2 surrounding and coaxially centered on a center conductor 3. A microstrip transmission line is illustrated in FIG. 1c. In FIG. 1c, the transmission line includes a broad reference or "ground" conductor illustrated as 5, and a strip conductor 6 spaced away from ground conductor 5 by a dielectric plate 7. The center or strip conductors of both types of transmission lines are biaxially symmetric, in that they are symmetric about a plane, such as plane 9 of FIGS. 1b and 1c. Plane 9 is orthogonal to the surface of the ground or outer conductor. Those skilled in the art know that signals may be transferred from one type of transmission line to another by appropriate couplers, so that the form of the transmission line is only of incidental interest.

As mentioned, the signals to be predistorted are applied by a transmission line to an input port 12 of coupler 14. A 3 dB directional coupler may include two coupled transmission lines such as 13 and 15 of FIG. 1a, which extend from port 12 to a port 28, and from a port 16 to a port 17. Such couplers operate near frequencies at which the portions of transmission lines 13 and 15 which are inductively and capacitively coupled are about λ/4 long. When operating with impedance-matched terminations at all the ports, such couplers respond to signals applied to a port such as 12 or 17 by producing at adjacent ports such as 16 or 28, respectively, signals at a reference phase (nominally 0°), and also produce signal at remote ports such as 28 or 16, respectively, which are at a relative phase of 90°, i.e. delayed by −90°.

In response to signals applied to port 12 of directional coupler 14 of FIG. 1a, signals with nominally 0° phase shift are coupled from directional coupler 14 by way of an output port 16 to a nonlinear network designated generally as 18, which includes a short-circuited attenuator and phase shifter illustrated together as a block 20. The nonlinearity is provided by a distortion generator, designated generally as 22. The particular form of distortion generator 22 illustrated in FIG. 1a is a pair of antiphase or antiparallel diodes 24, 26 as known in the art, for example, from U.S. Pat. No. 4,588,958, issued May 13, 1986 to Katz, et al. Such antiparallel diodes are advantageous by virtue of simplicity, low cost and reliability. Signals applied to input port 12 of hybrid coupler 14 are also coupled with a nominal 90°. phase shift to an output 28 for application to a linear channel designated generally as 30, which includes the cascade of a variable attenuator 32 and a phase shifter 34 short-circuited to ground 8. Signals applied to input terminal 12 are coupled into nonlinear channel 18 and into linear channel 30, are processed and reflected, and the reflected signals are coupled together and to an output port 36. The impedance of the antiparallel diode pair varies significantly as a function of frequency, temperature and power level, with the result that matching networks (not illustrated in FIG. 1a) associated with the diodes must be designed for compromise impedance values, or isolators must be used.

A nonlinearity generator using FET source-to-drain conductive paths is described in U.S. Pat. No. 5,038,113 issued Aug. 6, 1991 in the name of Katz, et al. FIG. 2a is a schematic diagram of a basic transmission predistortion equalizer 78 as described in Katz, et al. '113. Predistortion equalizer 78 uses a field effect transistor (FET) 80 including a source or drain electrode 82, drain or source electrode 84, with a source-to-drain conductive path designated 88 extending therebetween, and a gate electrode 86. Conductive path 88 is connected between an input port 90 and an output port 92 to which a generator 94 and a load 100, respectively, are connected. Generator 94 includes a source 96 of alternating voltage (AC), and also includes an internal impedance illustrated as 98. Internal impedance 98 and load 100 generally match a standard transmission line impedance.

A source of bias designated generally as 110 in FIG. 2a includes first and second voltage sources illustrated as batteries 112 and 114 having their negative and positive terminals, respectively, connected to ground, and their other terminals connected to opposite ends of a potentiometer 116, the wiper 118 of which is connected by way of an isolating element illustrated as a resistor 120 to gate electrode 86.

Additional control of the magnitude or phase of the transmission distortion of the generator of FIG. 2a is achieved by selection of a gate-to-ground impedance $(R \pm jX)$. An ancillary impedance or matching network illustrated as a dotted block 102 is connected between gate 86 and ground, which in general may be any circuit, however complex. In FIG. 2a, impedance 102 is illustrated as being a variable capacitor. At RF the physical dimensions in wavelengths of the variable capacitor may be such as to introduce a substantial inductive component of reactance, whereby the variable capacitor acts as if it were a series-resonant circuit, illustrated in FIG. 2b. As described in Katz, et al. '113, the distortion provided by distortion equalizer 78 of FIG. 2 varies with both bias voltage and gate-to-ground impedance.

FIG. 3 illustrates a reflective equalizer as described in the Katz '113 patent. In FIG. 3, elements corresponding to those of FIGS. 1a and 2a are designated by the same reference numerals. In FIG. 3, input signals to be equalized are applied by way of a transmission-line input port 10 to a port 12 of a 3 dB quadrature directional coupler 14. Coupler 14 couples the signals, with appropriate phase shifts, to ports 16 and 28. The signal at port 16 is applied by way of a transmission path 310 to the input port 390 of a linear reflective circuit 332 which is coupled or shorted to ground 8. The signals coupled to port 28 of directional coupler 14 are applied by way of a transmission path 312 to the input port 90 of a FET nonlinear reflective circuit such as that of FIG. 2a, in which port 92 is short-circuited to ground 8. Linear reflective circuit 332 and nonlinear reflective circuit 399 of FIG. 3 reflect the signals applied thereto with amplitude and phase which depends upon the component values and the diode bias, and the reflected signals are applied back to ports 16 and 28, respectively, of directional coupler 14. Directional coupler 14 combines the signals reflected to ports 16 and 28 to produce a combined signal which is applied to transmission-line output port 36. Thus, the arrangement of FIG. 8 as a whole is a transmission-type nonlinear circuit for distorting signals as they flow from port 10 to port 36, but it uses reflective circuits internally.

FIG. 4 illustrates the arrangement of FIG. 2 as adapted for use in nonlinear circuit 399 of FIG. 3. In FIG. 4, elements corresponding to those of FIG. 2 are designated by like reference numerals. FIG. 4 differs from FIG. 2 only in that port 92 is connected or short-circuited to ground. Signal applied from source 94 to port 90 flows through the source-to-drain conductive path of FET 80, is reflected at shorted port 92, and again traverses the FET back to input port 90.

FIG. 5 illustrates the use of impedance matching networks. Elements of FIG. 5 corresponding to those of FIGS. 2a and 4 are designated by like reference numerals. In FIG. 5, source or drain electrode 82 is connected to port 90 by way of a matching network 512, and drain or source electrode 84 is connected ground at port 92 by way of a matching network 514. Either or both matching networks 512 or 514 may be used, as known in the art. Matching networks 512 and 514 may each include a single series or shunt element, or networks of elements. As mentioned above, matching network 102 connected between gate electrode 86 and ground may be a complex network. The gate bias arrangement, illustrated in FIG. 5 as 510, couples voltage to gate 86 of FET 80 from a voltage divider illustrated as a pair of resistors 518 and 520. The bias voltage may be varied by adjusting the resistance of variable resistor 518. As an alternative, a potentiometer may be used.

Those skilled in the art know that the gate electrode of a FET forms a capacitance with the source or drain electrodes, and may have some slight conduction. If matching network 512 or 514 include series capacitors, a direct conductive path or galvanic continuity between the controllable conductive path 88 of FET 80 and ground (or other reference voltage) is broken. This in turn may change or eliminate the bias voltage applied between gate 86 and path 88, thereby undesirably affecting bias control of the FET. This may be corrected, when matching network 512 includes a series capacitor, by providing a galvanically conductive impedance to ground from source or drain electrode 82, such as inductor 522 of FIG. 5. Such a structure is often known as a "bias tee." When matching network 514 includes a series capacitor, an impedance such as inductor 524 may be connected to ground from drain or source electrode 84. If both matching networks 512 and 514 include series capacitors, it may be necessary to provide only one inductor such as inductor 522 or 524, rather than both, because of the conduction through controlled path 88. A suitable inductor for frequencies near 4 GHz could be a 0.7 mil (0.007 inch) diameter wire about 0.1 inch long, with one or two turns.

It has been found that a transmission directional coupler using reflective circuits as described in conjunction with FIG. 3 may not match standard transmission line impedances such as 50 ohms or 75 ohms, and it may be difficult to provide adequate matching to the input port of a power amplifier at all power levels. An improved nonlinear processor is desired.

SUMMARY OF THE INVENTION

A nonlinear signal translation arrangement includes a 3 dB quadrature hybrid or directional coupler including first, second, third and fourth ports. The source-to-drain conductive path of a first field effect transistor is coupled to the second port of the directional coupler, and the source-to-drain conductive path of a second field effect transistor is coupled to the third port of the directional coupler. A reactance arrangement is coupled between the gate electrodes of the first and second field effect transistors and reference potential. A bias arrangement is coupled to the gate electrodes of the first and second field effect transistors for applying first and second direct bias voltages to the gate electrodes. The first and fourth ports of the directional coupler are adapted to be placed in the path of signal flow for nonlinear modification of the signals traversing the arrangement. In one embodiment of the invention, a DC block is coupled in series with the controlled current path of at least one FET, and a bias tee or impedance is connected between a point of reference potential and a point lying between the DC block and the adjacent FET electrode.

DESCRIPTION OF THE DRAWING

FIG. 2b illustrates an equivalent circuit associated with a portion of the arrangement of FIG. 2a;

DESCRIPTION OF THE INVENTION

Figure 1A:
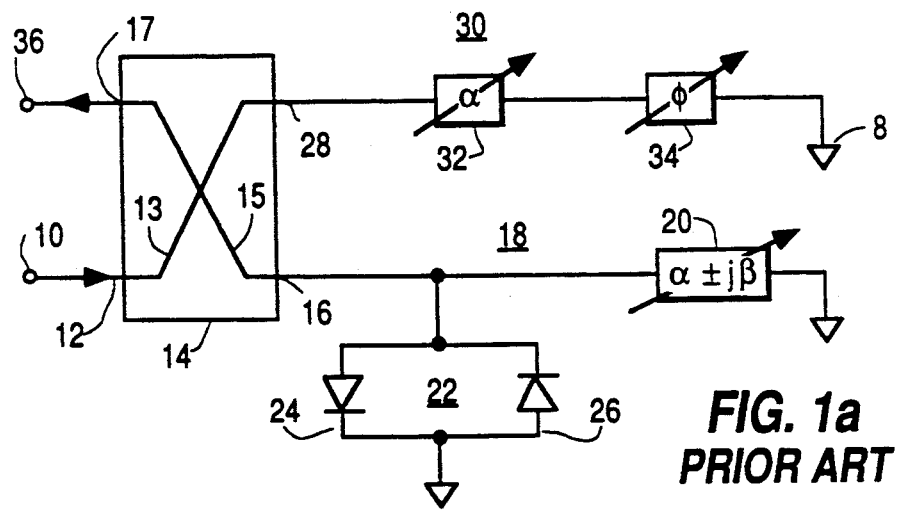
FIG. 1a is a diagram, in block and schematic form, illustrating a prior art nonlinear device including a directional coupler and reflective elements.
Figure 1B:
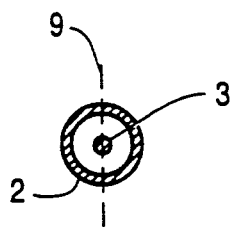
FIG. 1b illustrates a cross-section of a coaxial transmission line.
Figure 1C:
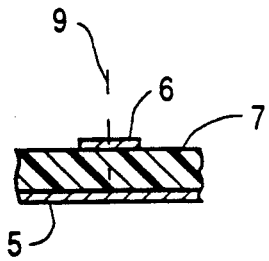
FIG. 1c is cross-section of a microstrip transmission line.
Figure 2A:
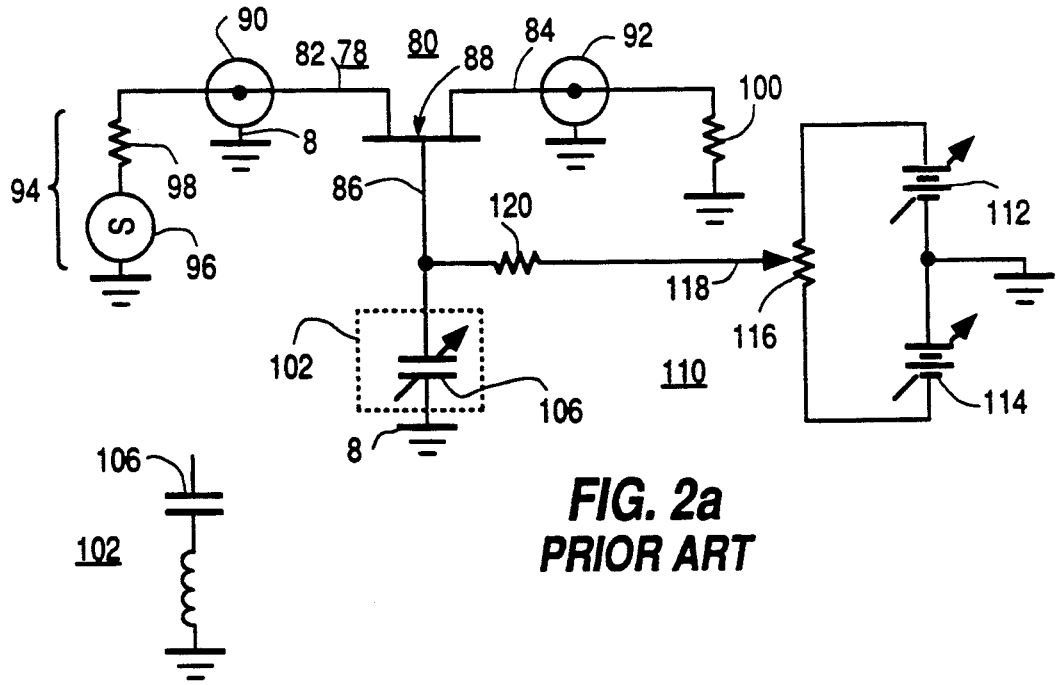
FIG. 2a is a diagram, in block and schematic form, of a prior art FET nonlinear element operating in a transmission mode.
Figure 2B:
Figure 3:
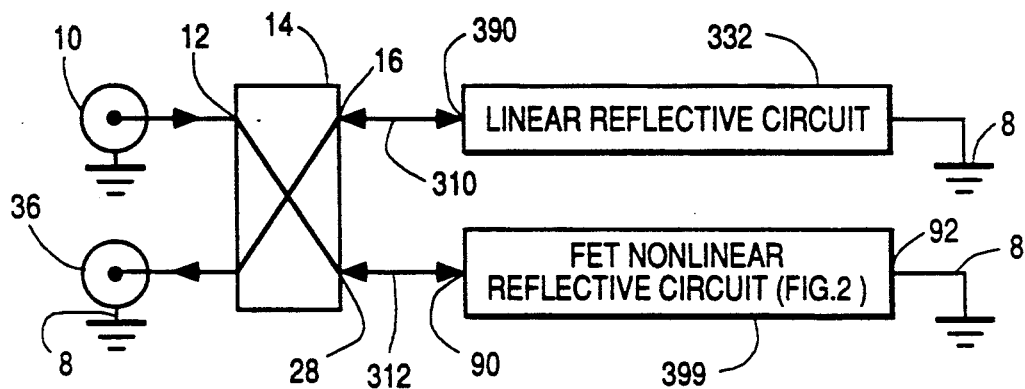
FIG. 3 is a block diagram of a prior art nonlinear arrangement utilizing a directional coupler together with a linear reflective circuit and a FET nonlinear reflective circuit.
Figure 6:
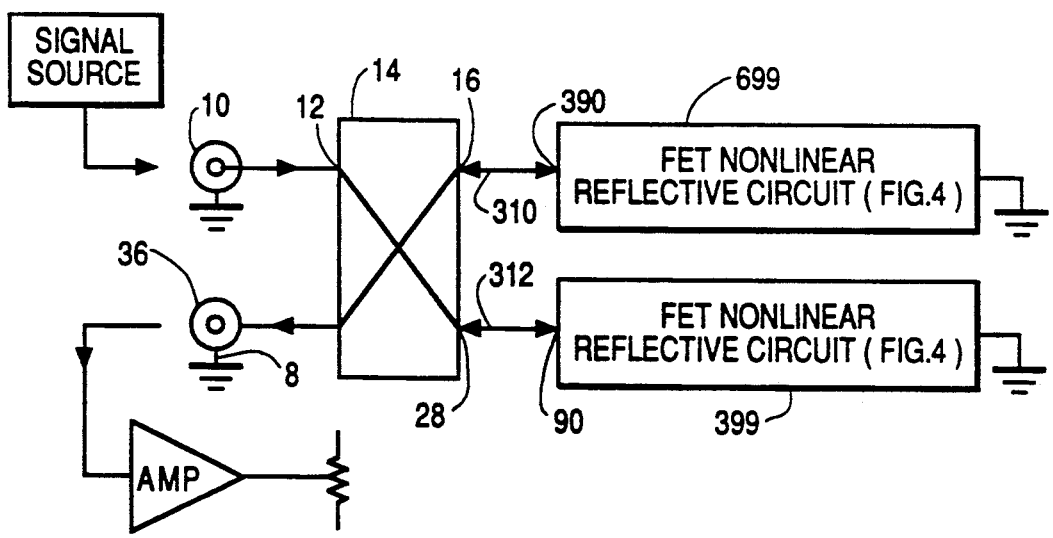
FIG. 6 illustrates a nonlinear arrangement in accordance with the invention.

FIG. 6 illustrates a nonlinear arrangement in accordance with the invention. Elements of FIG. 6 corresponding to those of FIG. 3 are designated by like reference numerals. FIG. 6 differs from FIG. 3 only in that linear reflective circuit 332 of FIG. 3 is replaced by a nonlinear reflective circuit 699. Nonlinear reflective circuit 699 is selected to match nonlinear reflective circuit 399. Also, at frequencies at which the dimensions of the circuit become a significant portion of a wavelength, nonlinear reflective circuit 699 is ideally made structurally identical to that of circuit 399. It may also be found to be desirable to select matched corresponding components, as for example by the use of matched capacitors 106 in networks 102, if capacitors are used therein.

Ideally, the FETs used in nonlinear circuits 399 and 699 would be perfectly matched, so that a single bias voltage could be applied to both gates for simultaneous control. However FETs will seldom, if ever, be perfectly matched to each other, so a separate bias source may be needed in association with each nonlinear reflective circuit 399 and 600. Those skilled in the art will know how to gang the sources together for simultaneous control operation.

Figure 4:
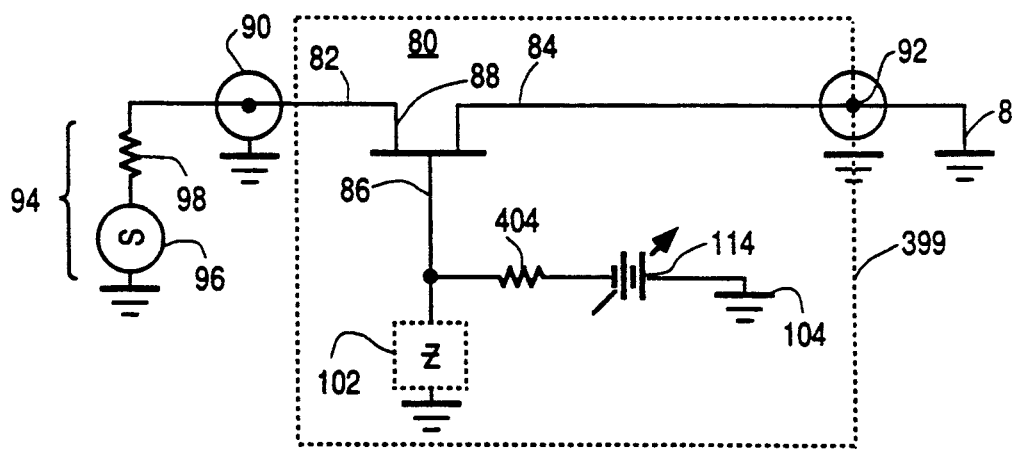
FIG. 4 is a diagram, in block and schematic form, illustrating the FET circuit of FIG. 2a, as used in the arrangement of FIG. 3.
Figures 7A, 7B:
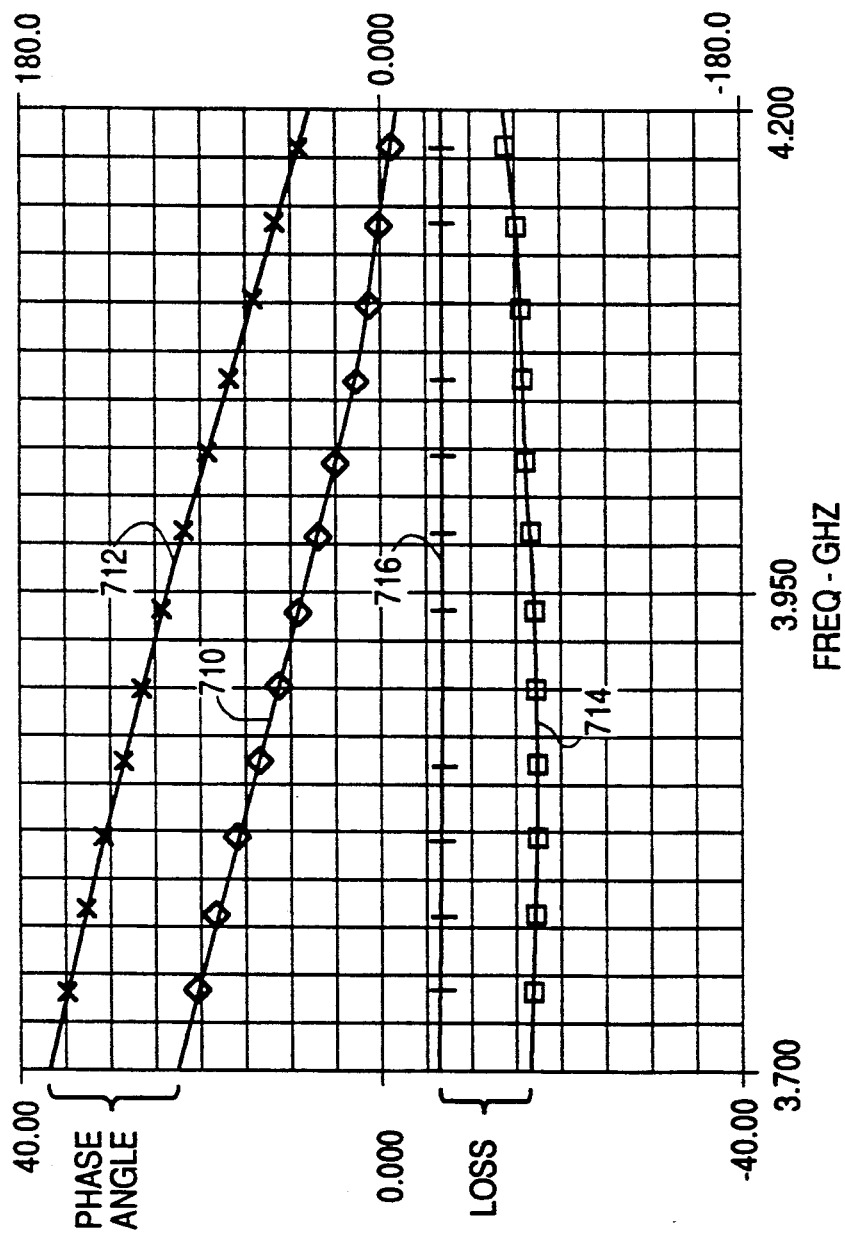
FIG. 7 is a representation of plots of calculated amplitude and phase as a function of frequency for the arrangement of FIG. 6.

FIGS. 7a and 7b plot C-band calculated phase and amplitude response, respectively, of a nonlinear arrangement according to FIG. 6, using nonlinear reflective circuits similar to that of FIG. 4, using models of a Lang Hybrid coupler, Nippon Electric Co. type NE 137 GaAs FETs, and a 2 pF capacitor, for two different input power levels. In FIG. 7a, plot 710 represents the phase angle at a relatively low input power of about −20 dBm, and plot 712 represents the phase angle at a higher power, of about 0 dBm. As illustrated, the phase angle increases at increasing power levels. This is the type of phase performance which would be desired for predistortion of the signal to be applied to a travelling-wave tube amplifier. In FIG. 7b, amplitude plot 714 represents output power normalized to input power at a low input signal level, and plot 716 corresponds at high input signal levels. Output signal level normalized to input signal level is generally known as gain when used with amplifiers. However, the nonlinear device of FIG. 6 has a gain of less than unity, termed loss. As can be seen in FIG. 7b, the "gain" has increased (actually loss has decreased) at higher input signal levels, which is what is required for compensating for the compression of a following power amplifier.

Figure 8B:
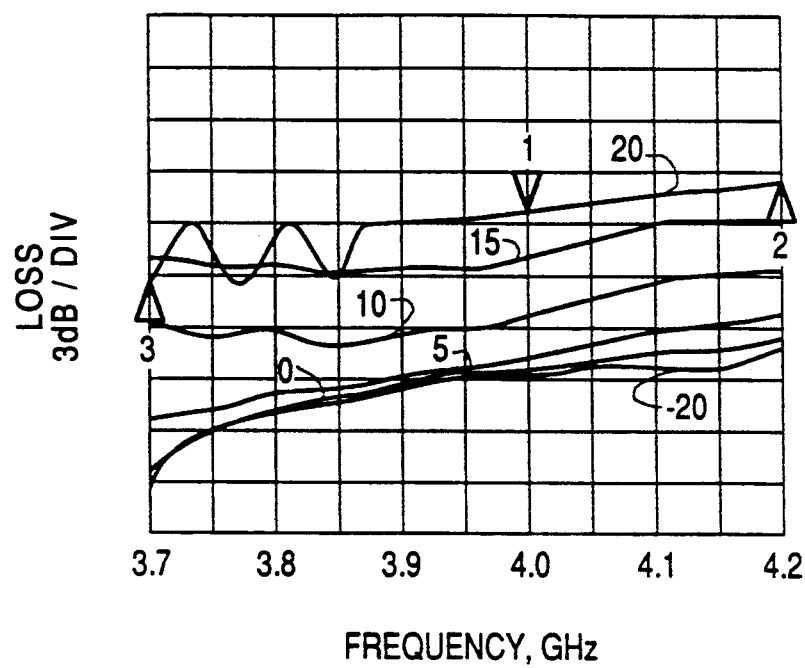
FIGS. 8a and 8b are plots of measured phase and amplitude response, respectively, versus frequency, of an arrangement according to the invention, with input signal level as a parameter.
Figure 8A:
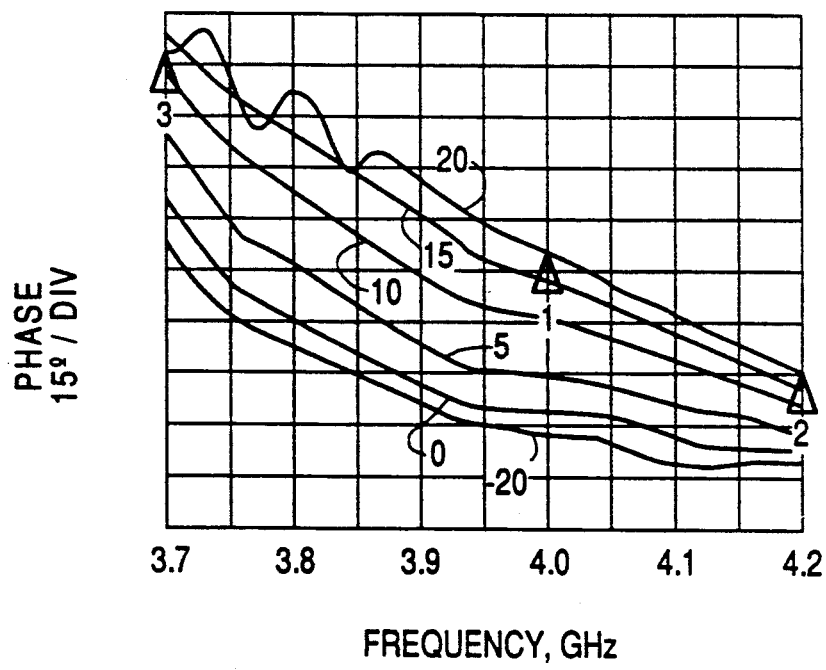

FIGS. 8a and 8b illustrate plots of measured relative phase and loss, respectively, versus frequency over the range 3.7 to 4.2 for a structure similar to that of FIG. 6, using nonlinear reflective circuits such as that of FIG. 4, using NEC type NE137 FETs, and with network 102 fitted with a 0.4 to 2 pF variable capacitor, and operated in a 50-ohm test system. In FIG. 8a, the plots are designated by the relative input signal level or power at which the plots were made. The plots are designated −20, 0, 5, 10, 15 and 20, which are merely power in dB relative to an arbitrary reference. For example, plot 0 of FIG. 8a represents the relative phase between port 10 and 36 of FIG. 6 at a reference input signal power, while plot 5 represents the phase at an input signal level 5 dB above the reference power level. The 0dB level corresponds to about −22 dBm (the triangular symbol designated by numerals 1, 2 and 3 are frequency markers generated by the automatic plotter which generated the measured data). As can be seen from FIG. 8a, the relative phase at any frequency progressively increases with increasing input signal level, which is desirable for certain classes of power amplifiers.

In FIG. 8b, the same input signal power levels were used as in FIG. 8a, so the plots of FIG. 8b are also designated by numerals −20, 0, 5, 10, 15 and 20. In FIG. 8b, the 0 and −20 plots are almost completely superposed, thereby indicating no change in gain at low input signal levels, which is a response which matches the performance of an amplifier at low signal levels.

Increasing the input signal level from the 5 dB level to the 10 dB level in FIG. 8b increases the gain by about 1 vertical increment, corresponding to 3 dB. Increasing the input signal level from the 10 dB level to the 15 dB level increases the gain by another 3 dB. This type of performance is equivalent to a signal expansion with increasing signal level, required to match the compression of a power amplifier with increasing signal power.

Figure 9B:
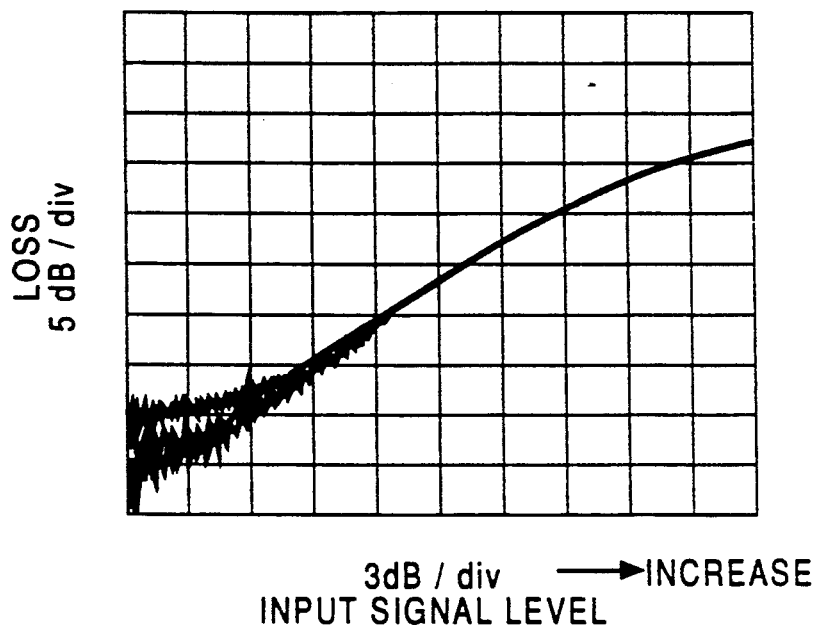
FIGS. 9a and 9b are plots of measured phase and amplitude response, respectively, versus input signal level, with FET gate voltage as a parameter.
Figure 9A:
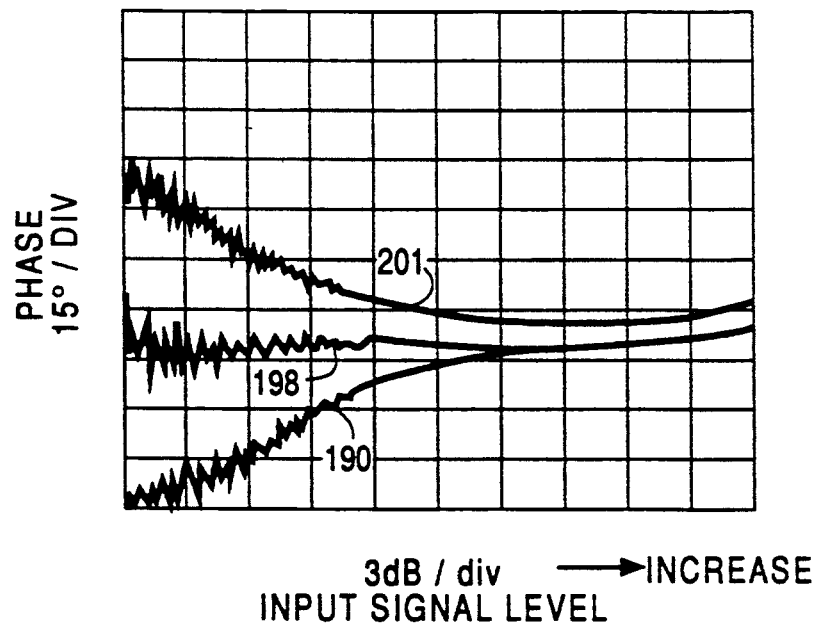

FIG. 9a plots measured relative phase versus input signal power of the structure of FIG. 6 at three different gate-to-ground voltages. The three plots of FIG. 9a are designated 190, 198 and 201, corresponding to gate-to-ground voltages of −1.90, −1.98 and −2.01 volts, respectively. Input signal power increases in the direction indicated by the arrow. With increasing signal power, the relative phase can be set to increase monotonically (plot 190), to be relatively flat (plot 198) or to decrease over most of the range (plot 201) by simply selecting the appropriate gate voltage. FIG. 9b represents the loss of the FIG. 6 structure as a function of input signal level, with gate voltage as a parameter. The three plots are superposed or congruent over most of the range. As illustrated in FIG. 9b, the loss decreases with increasing signal for all three value of gate voltage, namely 1.90, 1.98 and 2.01 volts. However, over most of the range the gate voltage has no effect on the amplitude performance, so the phase can be set independently of the amplitude. The amplitude response is adjusted by adjusting the gate impedance 102.

Figure 10:
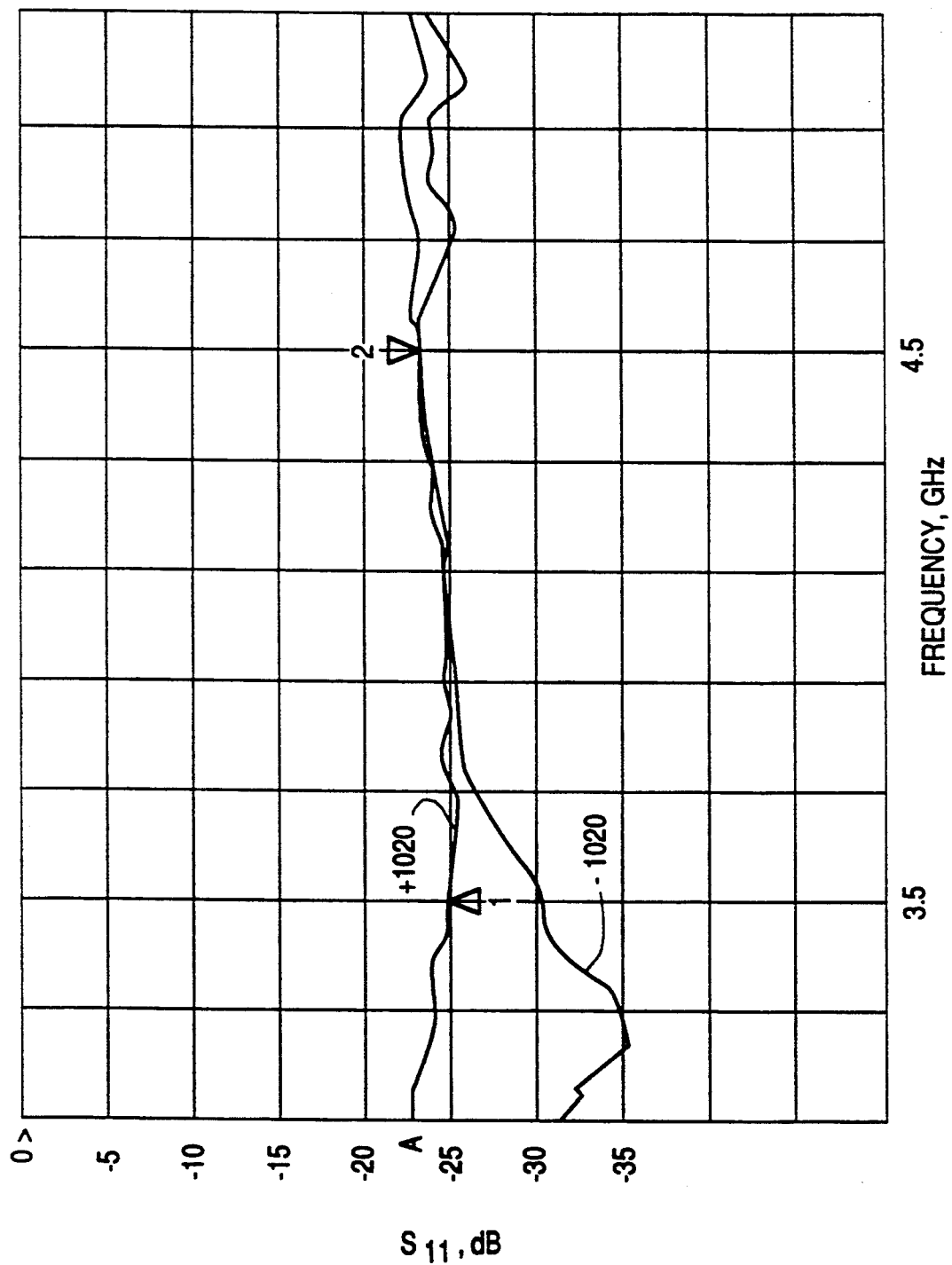
FIG. 10 is a plot, measured at port 10 of the arrangement of FIG. 6, of input return loss versus frequency and power level.

FIG. 10 plots the input return loss (which is related to impedance match) of the structure of FIG. 6 in a 50-ohm system, as a function of signal level. In FIG. 10, reference triangle 1 identifies 3.5 GHz, and triangle 2 identifies 4.5 GHz. The upper plot, designated +1020, represents the result of measurement made at +20 dBm, while the lower plot, designated −1020, is made at −20 dBm. The abscissa represents $S_{11}$ or return loss, with 0dB at the caret (>), and 5 dB/vertical division, so that the worst return loss, at point A, represents about −23 dB return loss.

In a particular embodiment of the invention useful in compensating the non-monotonic characteristics of certain TWTA's, the reflective nonlinear circuits coupled to ports 16 and 28 of the FIG. 6 arrangement may each include a cascade of FETs, such as the cascade described in the abovementioned Katz, et al. '113 patent.

Figure 5:
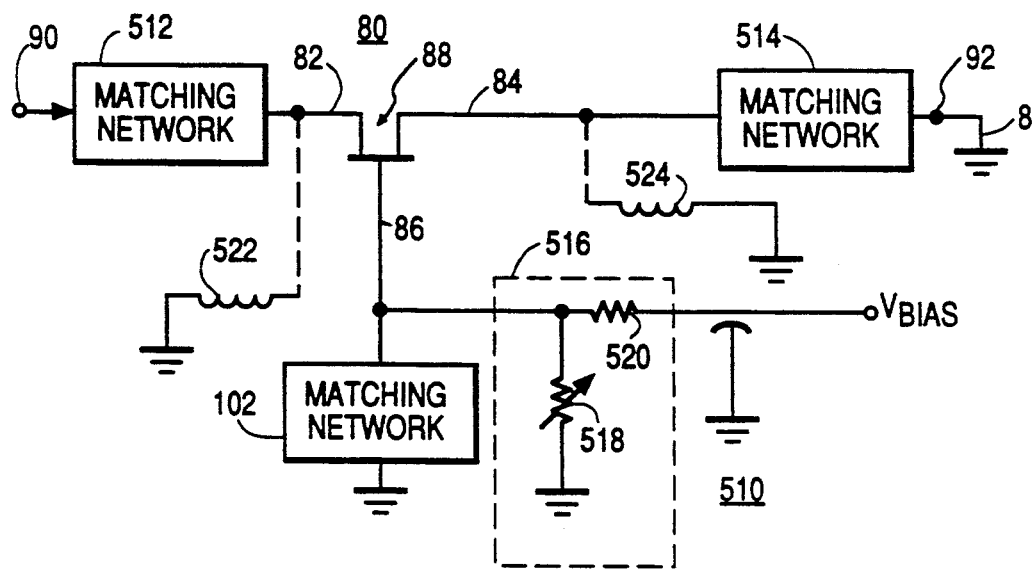
FIG. 5 illustrates another prior art FET nonlinear circuit usable in a reflective mode.

Other embodiments of the invention will be apparent to those skilled in the art. For example, one of the two gate matching impedance circuits 102 may be made adjustable to allow adjustment to compensate for unavoidable imbalances. The directional coupler may use microstrip, coaxial, stripline or other equivalent transmission lines technology. Ideally, the two FETs (or two sets of FETs) might be adjacent FETs from the same wafer on which they were grown, to enhance their matching. Instead of or in addition to an inductor such as 522 of FIG. 5, a resistor may be provided in general, a resistor with a few thousand ohms of resistance will provide enough RF impedance so as to be insignificant, but sufficiently high galvanic conduction to allow proper bias.

What is claimed is:

1. A nonlinear signal translation arrangement for operation about a center frequency, comprising:
   a 3 dB, quadrature directional coupler including first, second, third and fourth ports;
   first and second field-effect transistors, each of said field-effect transistors including a controllable source-to-drain conductive path, and a gate electrode by which said source-to-drain conductive path may be controlled;
   means for coupling said source-to-drain conductive path of said first field-effect transistor in series with said second port of said directional coupler, at least at frequencies about said center frequency;
   means for coupling said source-to-drain conductive path of said second field-effect transistor in series with said third port of said directional coupler, at least at frequencies about said center frequency;
   first reactance means coupled between said gate electrode of said first field-effect transistor and a source of reference potential;
   second reactance means coupled between said gate electrode of said second field-effect transistor and a source of a reference potential;
   bias means coupled to said gate electrodes of said first and second field-effect transistor means for applying first and second direct voltages to said gate electrodes of said first and second field-effect transistors, respectively; and
   means for coupling said first and fourth ports of said directional coupler in a path of signal flow at a frequency about said center frequency, whereby said signal flow is nonlinearly modified 2. An arrangement according to claim 1, wherein said directional coupler includes a first transmission line connected between said first and third ports, and a second transmission line connected between said second and fourth ports, said first and second transmission lines being capacitively and magnetically coupled for directional properties about said center frequency.

3. An arrangement according to claim 2, wherein said first and second transmission lines are capacitively and magnetically coupled over a physical length of approximately λ/4 at said center frequency.

4. An arrangement according to claim 3, wherein said first and second transmission lines each include an elongated, biaxially symmetric conductor spaced away from a larger common conductor, and wherein said means for coupling said source-to-drain conductive path of said first field-effect transistor across said second port of said directional coupler is a direct galvanic connecting of one of said source and drain of said first field-effect transistor to said symmetric conductor, and a direct galvanic connecting of the other one of said source and drain of said first field-effect transistors to said common conductor.

5. An arrangement according to claim 4, wherein said first reactance means comprises inductance means.

6. An arrangement according to claim 5, wherein said inductance means comprises a physical capacitor connected incircuit with a conductor having inductance to form a series resonant circuit, said series resonant circuit being inductive near said center frequency.

7. An arrangement according to claim 1, wherein said first reactance means comprises inductance means.

8. An arrangement according to claim 7, wherein said inductance means comprises a physical capacitor connected in-circuit with a conductor having inductance to form a series resonant circuit, said series resonant circuit being inductive near said center frequency.

9. An arrangement according to claim 1, wherein said means for coupling said first transistor includes a direct current block connected at a junction to said source-to-drain conductive path, and further comprising:

RF impedance means coupled to said junction and to said bias means, for applying said first direct voltage across said gate electrode and said conductive path of said first transistor.

10. In an arrangement according to claim 9 wherein said RF impedance means includes inductance means.

11. An arrangement according to claim 1, wherein said bias means applies equal first and second direct voltages to said gate electrodes of said first and second transistors, respectively.

12. A nonlinear signal translating circuit for operation near a frequency, comprising:

a 3 dB, quadrature directional coupler including first, second, third and fourth ports;

a first field-effect transistor including source, gate and drain electrodes, and a controllable current path extending between said source and drain electrodes, said controllable path being galvanically connected in series with said second port of said directional coupler;

a first reactive circuit connected between said gate electrode of said first transistor and a source of reference potential, said first reactive circuit including the series combination of a first discrete capacitor and a distributed first inductance, said first reactive circuit having a net inductive reactance at said frequency;

first biasing means coupled to said gate electrode of said first transistor and to a source of reference potential for applying a direct voltage to said gate electrode of said first transistor;

a second field-effect transistor including source, gate and drain electrodes, and a controllable current path extending between said source and drain electrodes, said controllable path being galvanically connected in series with said third port of said directional coupler;

a second reactive circuit connected between said gate electrode of said second transistor and a source of reference potential, said second reactive circuit including the series combination of a second discrete capacitor and a distributed second inductance, said second reactive circuit having a net inductive reactance at said frequency;

second biasing means coupled to said gate electrode of said second transistor and to a source of reference potential, for applying a direct voltage to said gate electrode of said second transistor;

whereby signal applied to said first port of said directional coupler is processed nonlinearly and appears at said fourth port of said directional coupler.

13. A nonlinear signal translation arrangement for operation about a center frequency, comprising:

a 3 dB, quadrature directional coupler including first, second, third and fourth ports, said directional coupler, when matched at all ports, responding to signal near said center frequency applied to said first port by producing reference-phase signal at said second port, and signal delayed by 90° relative to said reference phase at said third port, said directional coupler also responding to signal applied to said fourth port by producing reference-phase signal at said third port, and signal delayed by 90° relative to said reference phase at said second port;

first and second field-effect transistors each of said field-effect transistors including a controllable source-to-drain conductive path, and a gate electrode by which said source-to-drain conductive path may be controlled;

means for coupling said source-to-drain conductive path of said first field-effect transistor across said second port of said directional coupler, at least at frequencies about said center frequency;

means for coupling said source-to-drain conductive path of said second field-effect transistor across said third port of said directional coupler, at least at frequencies about said center frequency;

first reactance means coupled between said gate electrode of said first field-effect transistor and a source of reference potential;

second reactance means coupled between said gate electrode of said second field-effect transistor and a source of a reference potential;

bias means coupled to said gate electrodes of said first and second field-effect transistor means for applying first and second direct voltages to said gate electrodes of said first and second field-effect transistors, respectively; and means for coupling said first and fourth ports of said directional coupler in a path of signal flow at a frequency about said center frequency, whereby said signal flow is nonlinearly modified.

* * * * *